United States Patent
Honda et al.

(10) Patent No.: US 8,157,952 B2
(45) Date of Patent: Apr. 17, 2012

(54) PLASMA PROCESSING CHAMBER, POTENTIAL CONTROLLING APPARATUS, POTENTIAL CONTROLLING METHOD, PROGRAM FOR IMPLEMENTING THE METHOD, AND STORAGE MEDIUM STORING THE PROGRAM

(75) Inventors: Masanobu Honda, Nirasaki (JP);
Toshihiro Hayami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1267 days.

(21) Appl. No.: 11/442,287

(22) Filed: May 30, 2006

(65) Prior Publication Data
US 2006/0273733 A1 Dec. 7, 2006

Related U.S. Application Data

(60) Provisional application No. 60/691,267, filed on Jun. 17, 2005.

(30) Foreign Application Priority Data

Jun. 3, 2005 (JP) .................................. 2005-164535

(51) Int. Cl.
*H01J 7/24* (2006.01)
(52) U.S. Cl. .......... 156/345.44; 156/345.47; 156/345.48

(58) Field of Classification Search ............. 315/111.21;
118/723 VE; 156/345.28, 345.44, 345.45,
156/345.47, 345.48
See application file for complete search history.

(56) References Cited

U.S. PATENT DOCUMENTS
2006/0037701 A1* 2/2006 Koshiishi et al. ........ 156/345.44

FOREIGN PATENT DOCUMENTS
| JP | 01-231322 | 9/1989 |
| JP | 2003-155569 | 5/2003 |
| JP | 2005-101289 | 4/2005 |

* cited by examiner

*Primary Examiner* — Sylvia R. MacArthur
(74) *Attorney, Agent, or Firm* — Oblon, Spivak, McClelland, Maier & Neustadt, L.L.P.

(57) ABSTRACT

A plasma processing chamber that enables an amount of attached polymer to be controlled easily with a simple construction. A vessel 11 houses a semiconductor wafer W. A susceptor 12 is disposed in the vessel 11 and is connected to a lower electrode radio frequency power source 20. In a plasma processing chamber 10, RIE and ashing can be carried out on the semiconductor wafer W using plasma produced from processing gases introduced into the vessel 11. A side wall member 45 is disposed in the vessel 11 and exposed to the plasma. A potential of the side wall member 45 is set to either a floating potential or a ground potential in accordance with which of RIE and ashing is carried out.

5 Claims, 7 Drawing Sheets

PLASMA PROCESSING CHAMBER, POTENTIAL CONTROLLING APPARATUS, POTENTIAL CONTROLLING METHOD, PROGRAM FOR IMPLEMENTING THE METHOD, AND STORAGE MEDIUM STORING THE PROGRAM

BACKGROUND OF THE INVENTION

1. Field of the Invention

The present invention relates to a plasma processing chamber, a potential controlling apparatus, a potential controlling method, a program for implementing the method, and a storage medium storing the program, and in particular relates to a plasma processing chamber having therein a component element that is exposed to plasma.

2. Description of the Related Art

Plasma processing chambers having a cylindrical vessel, and electrodes that are disposed in the vessel and are connected to radio frequency power sources have been known from hitherto. In such a plasma processing chamber, a processing gas is introduced into the vessel, and the electrodes apply radio frequency electrical power into a space in the vessel. A semiconductor wafer is housed in the vessel as a substrate, and in this state the introduced processing gas is turned into plasma by the radio frequency electrical power, whereby ions and so on are produced, and the semiconductor wafer is subjected to plasma processing such as etching through the ions and so on.

In such a plasma processing chamber, in the case that a mixed gas of a reactive gas such as $C_4F_8$ gas and argon (Ar) gas is used as the processing gas, neutral active species (radicals) produced from the reactive gas become attached as a polymer to an inner side wall (hereinafter referred to merely as the "side wall") of the vessel. If the amount of polymer attached is too high, then when a semiconductor wafer is subjected to the plasma processing, polymer may peel away from the side wall and become attached to a surface of the semiconductor wafer as deposit; it is thus necessary to remove polymer attached to the side wall.

Polymer attached to the side wall is preferably removed by making cations produced when the processing gas is turned into the plasma collide with the side wall. The number of cations colliding with the side wall is affected by the potential of the side wall. Specifically, if the potential of the side wall is low and the potential difference between the side wall and the space in which the plasma is formed from the processing gas is high, then the number of cations colliding with the side wall is increased, and hence the amount of polymer attached is reduced.

However, the potential of the side wall is determined by the anode/cathode ratio which is affected by the electrode shape and the side wall shape, and the magnitude of the radio frequency electrical power which is set so as to obtain desired plasma processing results on the semiconductor wafers. Controlling the potential of the side wall is thus difficult. Controlling polymer removal is thus not easy, and hence if a depositing process for which polymer is readily attached to the side wall and thus deposit is readily attached to the semiconductor wafer surface is carried out repeatedly, then the amount of polymer attached becomes excessive, and hence the frequency of cleaning the side wall must be increased; as a result, the plasma processing chamber utilization ratio decreases.

In recent years, processing chambers have thus been developed according to which the potential of the side wall is actively controlled so as to remove polymer from the side wall, for example a processing chamber according to which once the operating time has reached a predetermined value, the side wall is selectively connected to ground or a radio frequency power source, the side wall being connected to the radio frequency power source and the potential of the side wall being set to a negative potential when removing polymer that has become attached to the side wall, whereby cations are made to collide with the side wall so as to remove polymer from the side wall (see, for example, Japanese Laid-open Patent Publication (Kokai) No. H01-231322).

However, for the processing chamber according to Japanese Laid-open Patent Publication (Kokai) No. H01-231322, in addition to the radio frequency power sources for the electrodes, a radio frequency power source for the side wall, i.e. a radio frequency power source for a processing chamber component element other than the electrodes, is required. There is thus a problem that the construction of the processing chamber becomes complex.

Moreover, for the processing chamber according to Japanese Laid-open Patent Publication (Kokai) No. H01-231322, the radio frequency power source is connected to the side wall so as to remove polymer from the side wall only once the operating time has reached a predetermined value. Controlling the amount of attached polymer is thus difficult, and as a result in the case that a depositing process as described above, and a deposit-less process for which neutral active species are not produced and hence there is no attachment of polymer to the side wall and thus no attachment of deposit to the semiconductor wafer surface such as a process using $O_2$ gas as the processing gas are carried out repeatedly in a single plasma processing chamber, then if the polymer is completely removed from the side wall, the cations will collide not with the polymer but rather directly with the side wall, and hence the side wall will be worn away. As a result, there will again be a problem of the plasma processing chamber utilization ratio decreasing.

SUMMARY OF THE INVENTION

It is an object of the present invention to provide a plasma processing chamber, a potential controlling apparatus, a potential controlling method, a program for implementing the method, and a storage medium storing the program, that enable the amount of attached polymer to be controlled easily with a simple construction.

To attain the above object, in a first aspect of the present invention, there is provided a plasma processing chamber having a vessel housing a substrate, and at least one electrode that is disposed in the vessel and is connected to a radio frequency power source, wherein at least two types of plasma processing can be carried out on the substrate using plasma produced from a processing gas introduced into the vessel, the plasma processing chamber further comprising a processing chamber component element that is disposed in the vessel and exposed to the plasma and a potential controlling apparatus that sets a potential of the processing chamber component element to either a floating potential or a ground potential in accordance with which of the at least two types of plasma processing is carried out.

According to the construction of the first aspect as described above, the potential of the processing chamber component element that is disposed in the vessel and exposed to the plasma is set to either a floating potential or a ground potential in accordance with which of the at least two types of plasma processing is carried out. As a result, a radio frequency power source for the processing chamber component element becomes unnecessary, and moreover the amount of attachment of attached matter to the processing chamber component element can be controlled in accordance with which plasma processing is carried out, and hence control of the amount of attachment of attached matter can be carried out easily with a simple construction.

Preferably, the at least two types of plasma processing comprise at least one depositing process in which attached matter is attached to the processing chamber component element, and at least one deposit-less process in which attached matter is not attached to the processing chamber component element, and the potential controlling apparatus sets the potential of the processing chamber component element to the ground potential during the at least one depositing process, and sets the potential of the processing chamber component element to the floating potential during the at least one deposit-less process.

According to the construction of the first aspect as described above, the at least two types of plasma processing comprise at least one depositing process in which attached matter is attached to the processing chamber component element, and at least one deposit-less process in which attached matter is not attached to the processing chamber component element, and the potential of the processing chamber component element is set to the ground potential during the at least one depositing process, and is set to the floating potential during the at least one deposit-less process. As a result, attached matter can be prevented from becoming excessively attached to the processing chamber component element during the at least one depositing process, and wearing away of the processing chamber component element can be prevented during the at least one deposit-less process. The utilization ratio of the plasma processing chamber can thus be prevented from decreasing.

Preferably, the processing chamber component element is electrically floating, and the potential controlling apparatus has at least one electrically grounded component element contacting member, the at least one component element contacting member being freely contactable with the processing chamber component element.

According to the construction of the first aspect as described above, the processing chamber component element is electrically floating, and the at least one electrically grounded component element contacting member is freely contactable with the processing chamber component element. As a result, switching of the potential of the processing chamber component element between the floating potential and the ground potential can be carried out reliably.

More preferably, the processing chamber component element has at least one recess-like hole therein, and the at least one component element contacting member has a projecting portion that is freely engageable with the at least one recess-like hole.

According to the construction of the first aspect as described above, the processing chamber component element has at least one recess-like hole therein, and the at least one component element contacting member has a projecting portion that is freely engageable with the at least one recess-like hole. As a result, the switching of the potential of the processing chamber component element between the floating potential and the ground potential can be carried out with a simple construction.

Further preferably, the at least one recess-like hole has a narrow portion therein, and at least one of the narrow portion and the projecting portion comprises an elastic member.

According to the construction of the first aspect as described above, the at least one recess-like hole in the processing chamber component element has a narrow portion therein, and at least one of the narrow portion and the projecting portion of each component element contacting member comprises an elastic member. As a result, the processing chamber component element and the at least one component element contacting member can be made to contact one another reliably.

Further preferably, the vessel is cylindrical, the processing chamber component element is a cylindrical member covering an inner peripheral surface of the vessel, a plurality of the recess-like holes are disposed around a circumference of the cylindrical member, and the projecting portion of each of a plurality of the component element contacting members is freely engageable with a corresponding one of the recess-like holes.

According to the construction of the first aspect as described above, the vessel is cylindrical, the processing chamber component element is a cylindrical member covering the inner peripheral surface of the vessel, a plurality of the recess-like holes are disposed around the circumference of the cylindrical member, and the projecting portion of each of a plurality of the component element contacting members is freely engageable with a corresponding one of the recess-like holes. As a result, when the processing chamber component element and the component element contacting members are in contact with one another, unevenness in the potential over the processing chamber component element can be prevented from arising, and hence the amount of attachment of attached matter can be controlled uniformly.

Alternatively, the vessel is cylindrical, the processing chamber component element is a cylindrical member covering an inner peripheral surface of the vessel, the cylindrical member has in an end portion thereof a groove that is formed extending around a circumference of the cylindrical member, and the at least one component element contacting member comprises a single component element contacting member that is retiform and is freely engageable with the groove.

According to the construction of the first aspect as described above, the vessel is cylindrical, the processing chamber component element is a cylindrical member covering the inner peripheral surface of the vessel, the cylindrical member has in an end portion thereof a groove that is formed extending around the circumference of the cylindrical member, and the component element contacting member is retiform and is freely engageable with the groove. As a result, when the processing chamber component element and the component element contacting member are in contact with one another, unevenness in the potential over the processing chamber component element can be reliably prevented from arising, and hence the amount of attachment of attached matter can be controlled yet more uniformly.

Preferably, the processing chamber component element is electrically floating, and the potential controlling apparatus has a grounding line for grounding the processing chamber component element, and a switching device disposed in the grounding line for switching between disconnection and connection of the grounding line.

According to the construction of the first aspect as described above, the processing chamber component element is electrically floating, and the potential controlling apparatus has a grounding line for grounding the processing chamber component element, and a switching device disposed in the grounding line for switching between disconnection and connection of the grounding line. As a result, switching of the potential of the processing chamber component element between the floating potential and the ground potential can be carried out with a simple construction.

Preferably, the potential controlling apparatus has a variable impedance element disposed in the grounding line.

According to the construction of the first aspect as described above, the potential controlling apparatus has a variable impedance element disposed in the grounding line. As a result, the rate of change of the potential of the processing chamber component element can be controlled, and hence the amount of attachment of attached matter can be controlled more finely.

Preferably, the variable impedance element changes an impedance in accordance with an amount of attached matter attached to the processing chamber component element.

According to the construction of the first aspect as described above, the variable impedance element changes the impedance in accordance with the amount of attached matter attached to the processing chamber component element. As a result, the potential of the processing chamber component element can be controlled in accordance with the amount of attached matter, and hence the amount of attachment of attached matter can be controlled more finely.

Preferably, the variable impedance element changes an impedance in synchronization with a frequency of the radio frequency power source.

According to the construction of the first aspect as described above, the variable impedance element changes the impedance in synchronization with the frequency of the radio frequency power source. As a result, fluctuations in the amount of attachment of attached matter during the plasma processing can be suppressed.

Preferably, the variable impedance element is one selected from a group of a variable inductor and a variable capacitor.

According to the construction of the first aspect as described above, the variable impedance element is a variable inductor or a variable capacitor. As a result, the amount of attachment of attached matter can be controlled more finely with a simpler construction.

To attain the above object, in a second aspect of the present invention, there is provided a potential controlling apparatus disposed in a vessel of a plasma processing chamber that comprises the vessel housing a substrate and at least one electrode disposed in the vessel and connected to a radio frequency power source, and the plasma processing chamber being able to carry out at least two types of plasma processing on the substrate using plasma produced from a processing gas introduced into the vessel, wherein a potential of a processing chamber component element, which is disposed in the vessel in the plasma processing chamber in which, the processing chamber component element being exposed to the plasma, can be set to either a floating potential or a ground potential in accordance with which of the at least two types of plasma processing is carried out.

Preferably, the at least two types of plasma processing comprise at least one depositing process in which attached matter is attached to the processing chamber component element, and at least one deposit-less process in which attached matter is not attached to the processing chamber component element, and the potential controlling apparatus sets the potential of the processing chamber component element to the ground potential during the at least one depositing process, and sets the potential of the processing chamber component element to the floating potential during the at least one deposit-less process.

Preferably, the processing chamber component element is electrically floating, and the potential controlling apparatus has at least one electrically grounded component element contacting member, the at least one component element contacting member being freely contactable with the processing chamber component element.

Preferably, the processing chamber component element is electrically floating, and the potential controlling apparatus has a grounding line for grounding the processing chamber component element, and a switching device disposed in the grounding line for switching between disconnection and connection of the grounding line.

To attain the above object, in a third aspect of the present invention, there is provided a potential controlling method for a processing chamber component element, which is disposed in a vessel housing a substrate in a plasma processing chamber that comprises the vessel and at least one electrode that is disposed in the vessel and is connected to a radio frequency power source, the plasma processing chamber being able to carry out at least two types of plasma processing on the substrate using plasma produced from a processing gas introduced into the vessel, and the processing chamber component element being exposed to the plasma, the potential controlling method comprising a potential setting step of setting a potential of the processing chamber component element to either a floating potential or a ground potential in accordance with which of the at least two types of plasma processing is carried out.

Preferably, the at least two types of plasma processing comprise at least one depositing process in which attached matter is attached to the processing chamber component element, and at least one deposit-less process in which attached matter is not attached to the processing chamber component element, and the potential setting step comprises setting the potential of the processing chamber component element to the ground potential during the at least one depositing process, and setting the potential of the processing chamber component element to the floating potential during the at least one deposit-less process.

To attain the above object, in a fourth aspect of the present invention, there is provided a program for causing a computer to implement a potential controlling method for a processing chamber component element, which is disposed in a vessel housing a substrate in a plasma processing chamber that comprises the vessel and at least one electrode that is disposed in the vessel and is connected to a radio frequency power source, the plasma processing chamber being able to carry out at least two types of plasma processing on the substrate using plasma produced from a processing gas introduced into the vessel, and the processing chamber component element being exposed to the plasma, the program comprising a potential setting module for setting a potential of the processing chamber component element to either a floating potential or a ground potential in accordance with which of the at least two types of plasma processing is carried out.

To attain the above object, in a fifth aspect of the present invention, there is provided a computer-readable storage medium storing a program for causing a computer to implement a potential controlling method for a processing chamber component element, which is disposed in a vessel housing a substrate in a plasma processing chamber that comprises the vessel and at least one electrode that is disposed in the vessel and is connected to a radio frequency power source, the plasma processing chamber being able to carry out at least two types of plasma processing on the substrate using plasma produced from a processing gas introduced into the vessel, and the processing chamber component element being exposed to the plasma, the program comprising a potential setting module for setting a potential of the processing chamber component element to either a floating potential or a ground potential in accordance with which of the at least two types of plasma processing is carried out.

The above and other objects, features, and advantages of the invention will become more apparent from the following detailed description taken in conjunction with the accompanying drawings.

BRIEF DESCRIPTION OF THE DRAWINGS

FIG. 3A is a view showing a state before the tip of the conducting member is engaged with the conducting member housing hole; and FIG. 3B is a view showing a state after the tip of the conducting member has been engaged with the conducting member housing hole;

FIG. 4A is a bar chart showing deposition rates for floating parts; and

FIG. 4B is a bar chart showing deposition rates for grounded parts;

DETAILED DESCRIPTION OF THE PREFERRED EMBODIMENTS

The present invention will now be described in detail with reference to the drawings showing preferred embodiments thereof.

First, a plasma processing chamber according to a first embodiment of the present invention will be described.

Figure 1:
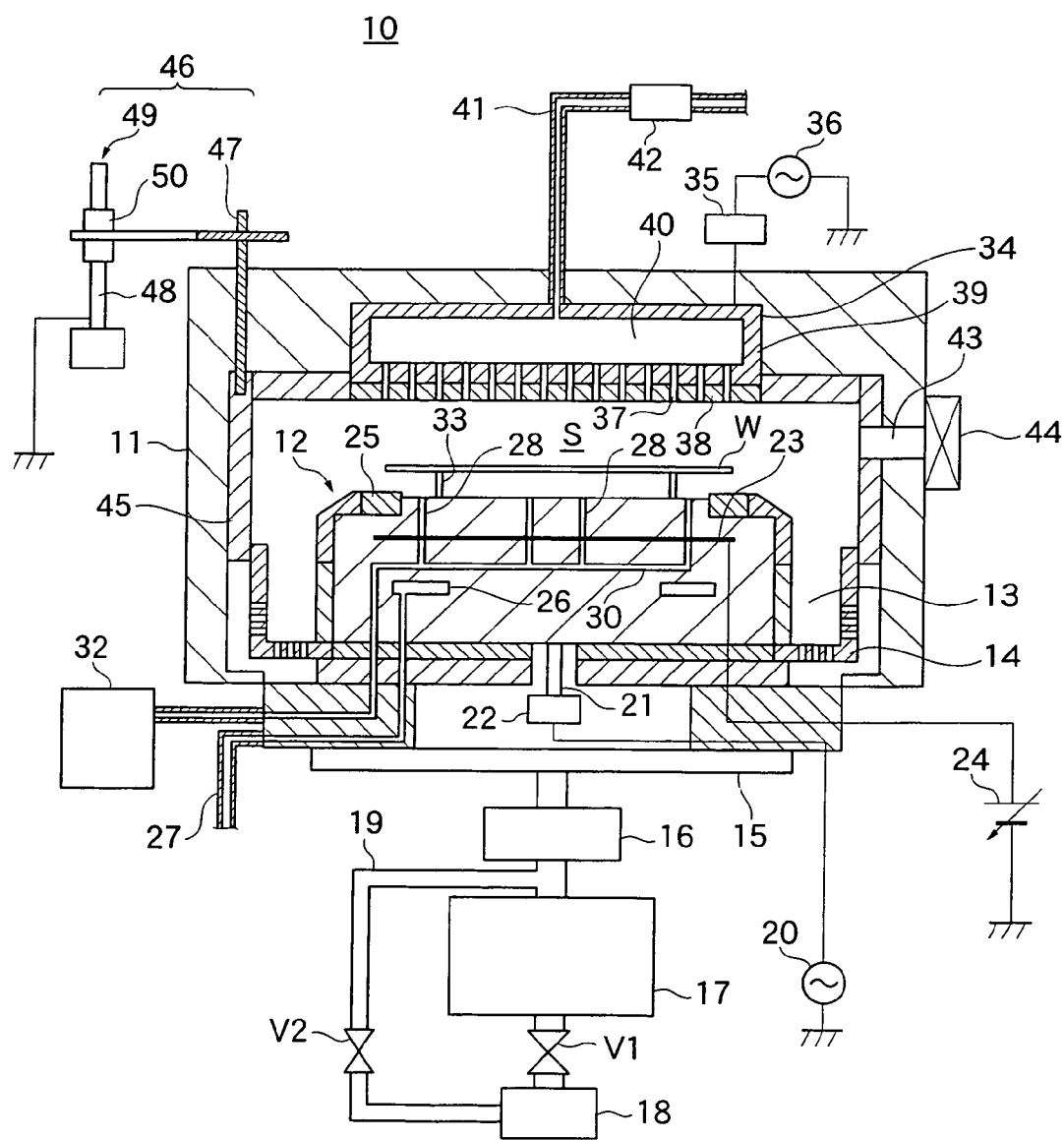
FIG. 1 is a sectional view schematically showing the construction of a plasma processing chamber according to a first embodiment of the present invention.

FIG. 1 is a sectional view schematically showing the construction of the plasma processing chamber according to the present embodiment. The plasma processing chamber is constructed so as to be able to carry out RIE (reactive ion etching) and ashing on semiconductor wafers W as substrates.

As shown in FIG. 1, the plasma processing chamber 10 has a cylindrical vessel 11. A cylindrical susceptor 12 is disposed in the vessel 11 as a stage on which is mounted a semiconductor wafer W (hereinafter referred to merely as a "wafer W") having a diameter of, for example, 300 mm.

In the plasma processing chamber 10, an exhaust path 13 that acts as a flow path through which gas molecules above the susceptor 12 are exhausted to the outside of the vessel 11 is formed between an inside side wall of the vessel 11 and a side face of the susceptor 12. An annular baffle plate 14 that prevents leakage of plasma is disposed part way along the exhaust path 13. A space in the exhaust path 13 downstream of the baffle plate 14 bends round below the susceptor 12, and is communicated with an automatic pressure control valve (hereinafter referred to as the "APC valve") 15, which is a variable butterfly valve. The APC valve 15 is connected via an isolator 16 to a turbo-molecular pump (hereinafter referred to as the "TMP") 17, which is an exhausting pump for evacuation. The TMP 17 is connected via a valve V1 to a dry pump (hereinafter referred to as the "DP") 18, which is also an exhausting pump. An exhaust flow path comprised of the APC valve 15, the isolator 16, the TMP 17, the valve V1, and the DP 18 is used for controlling the pressure in the vessel 11 using the APC valve 15, and also for reducing the pressure in the vessel 11 down to a substantially vacuum state using the TMP 17 and the DP 18.

Moreover, piping 19 is connected from between the isolator 16 and the TMP 17 to the DP 18 via a valve V2. An exhaust flow path comprised of the piping 19 and the valve V2 bypasses the TMP 17, and is used for roughing the vessel 11 using the DP 18.

A lower electrode radio frequency power source 20 is connected to the susceptor 12 via a feeder rod 21 and a matcher 22. The lower electrode radio frequency power source 20 supplies predetermined radio frequency electrical power to the susceptor 12. The susceptor 12 thus acts as a lower electrode. The matcher 22 reduces reflection of the radio frequency electrical power from the susceptor 12 so as to maximize the efficiency of the supply of the radio frequency electrical power into the susceptor 12.

A disk-shaped ESC electrode plate 23 comprised of an electrically conductive film is provided in an upper portion of the susceptor 12. A DC power source 24 is electrically connected to the ESC electrode plate 23. A wafer W is attracted to and held on an upper surface of the susceptor 12 through a Johnsen-Rahbek force or a Coulomb force generated by a DC voltage applied to the ESC electrode plate 23 from the DC power source 24. Moreover, an annular focus ring 25 is provided on an upper portion of the susceptor 12 so as to surround the wafer W attracted to and held on the upper surface of the susceptor 12. The focus ring 25 is exposed to a space S, described below, and focuses plasma in the space S toward a surface of the wafer W, thus improving the efficiency of the RIE or ashing.

An annular coolant chamber 26 that extends, for example, in a circumferential direction of the susceptor 12 is provided inside the susceptor 12. A coolant, for example cooling water, at a predetermined temperature is circulated through the coolant chamber 26 via coolant piping 27 from a chiller unit (not shown). A processing temperature of the wafer W attracted to and held on the upper surface of the susceptor 12 is controlled through the temperature of the coolant.

A plurality of heat-transmitting gas supply holes 28 are provided in a portion of the upper surface of the susceptor 12 on which the wafer W is attracted and held (hereinafter referred to as the "attracting surface").

The heat-transmitting gas supply holes 28 are connected to a heat-transmitting gas supply unit 32 by a heat-transmitting gas supply line 30 provided inside the susceptor 12. The heat-transmitting gas supply unit 32 supplies helium gas as a heat-transmitting gas via the heat-transmitting gas supply holes 28 into a gap between the attracting surface of the susceptor 12 and a rear surface of the wafer W.

A plurality of pusher pins 33 are provided in the attracting surface of the susceptor 12 as lifting pins that can be made to project out from the upper surface of the susceptor 12. The pusher pins 33 are connected to a motor (not shown) by a ball screw (not shown), and can be made to project out from the attracting surface of the susceptor 12 through rotational motion of the motor, which is converted into linear motion by the ball screw. The pusher pins 33 are housed inside the susceptor 12 when a wafer W is being attracted to and held on the attracting surface of the susceptor 12 so that the wafer W can be subjected to the RIE or ashing, and are made to project out from the upper surface of the susceptor 12 so as to lift the wafer W up away from the susceptor 12 when the wafer W is to be transferred out from the vessel 11 after having been subjected to the RIE or ashing.

A gas introducing shower head 34 is disposed in a ceiling portion of the vessel 11 facing the susceptor 12. An upper electrode radio frequency power source 36 is connected to the gas introducing shower head 34 via a matcher 35. The upper electrode radio frequency power source 36 supplies predetermined radio frequency electrical power to the gas introducing shower head 34. The gas introducing shower head 34 thus acts as an upper electrode. The matcher 35 has a similar function to the matcher 22, described earlier.

The gas introducing shower head 34 has a ceiling electrode plate 38 having a large number of gas holes 37 therein, and an electrode support 39 from which the ceiling electrode plate 38 is detachably hung. A buffer chamber 40 is provided inside the electrode support 39. A processing gas introducing pipe 41 is connected from a processing gas supply unit (not shown) to the buffer chamber 40. A piping insulator 42 is disposed part way along the processing gas introducing pipe 41. The piping insulator 42 is made of an electrically insulating material, and prevents the radio frequency electrical power supplied to the gas introducing shower head 34 from leaking into the processing gas supply unit via the processing gas introducing pipe 41. A processing gas supplied from the processing gas introducing pipe 41 into the buffer chamber 40 is supplied by the gas introducing shower head 34 into the vessel 11 via the gas holes 37.

A transfer port 43 for the wafers W is provided in a side wall of the vessel 11 in a position at the height of a wafer W that has been lifted up from the susceptor 12 by the pusher pins 33. A gate valve 44 for opening and closing the transfer port 43 is provided in the transfer port 43.

Radio frequency electrical power is supplied to the susceptor 12 and the gas introducing shower head 34 in the vessel 11 of the plasma processing chamber 10 as described above so as to apply radio frequency electrical power into the space S between the susceptor 12 and the gas introducing shower head 34, whereupon high-density plasma is produced from the processing gas supplied into the space S from the gas introducing shower head 34, whereby a wafer W is subjected to the RIE or ashing by the plasma.

Specifically, when subjecting a wafer W to the RIE or ashing in the plasma processing chamber 10, first the gate valve 44 is opened, and the wafer W to be processed is transferred into the vessel 11, and attracted to and held on the attracting surface of the susceptor 12 by applying a DC voltage to the ESC electrode plate 23. Moreover, the processing gas is supplied from the gas introducing shower head 34 into the vessel 11 at a predetermined flow rate and a predetermined flow ratio between the respective component gases of the processing gas, and the pressure inside the vessel 11 is controlled to a predetermined value using the APC valve 15 and so on. Furthermore, radio frequency electrical power is applied into the space S in the vessel 11 from the susceptor 12 and the gas introducing shower head 34. The processing gas introduced in from the gas introducing shower head 34 is thus turned into plasma in the space S. The plasma is focused onto the surface of the wafer W by the focus ring 25, whereby the surface of the wafer W is physically/chemically etched.

Operation of the component elements of the plasma processing chamber 10 described above is controlled in accordance with a program for the RIE or ashing by a CPU of a control unit (not shown) of the plasma processing chamber 10.

The plasma processing chamber 10 further has a cylindrical side wall member 45 (processing chamber component element) covering an inner peripheral surface of the cylindrical vessel 11. Because the side wall member 45 covers the inner peripheral surface of the vessel 11, the side wall member 45 faces onto the space S and is thus exposed to the plasma produced in the space S. The side wall member 45 is made of aluminum, a surface thereof facing the space S being coated with alumite. The side wall member 45 is electrically floating. A potential thus arises on the side wall member 45 in accordance with the anode/cathode ratio which is affected by the shape of the susceptor 12 and the side wall member 45, and the magnitude of the radio frequency electrical power as a process parameter which is set so as to obtain desired RIE or ashing results on a wafer W. This potential is, however, controlled by a potential controlling apparatus 46, described below.

The potential controlling apparatus 46 has rod-shaped conducting members 47 (component element contacting members), a base 49 that is electrically grounded and has a guide rod 48 provided extending in a vertical direction in FIG. 1, and a raising/lowering member 50 that holds the conducting members 47 and rises/falls along the guide rod 48 so as to raise/lower the conducting members 47. The conducting members 47, the base 49, and the raising/lowering member 50 are each made of a conductive material, and hence the conducting members 47 are electrically grounded via the base 49 and the raising/lowering member 50.

Figure 2:
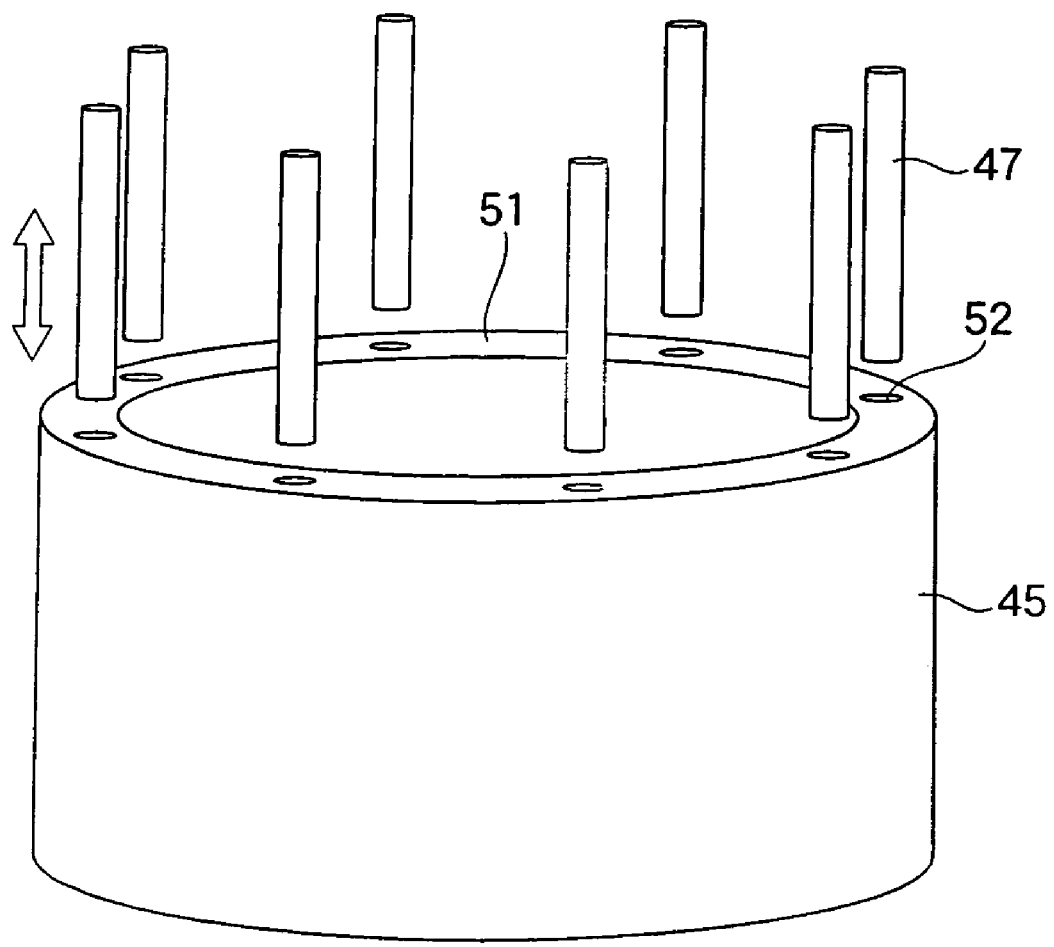
FIG. 2 is a view for explaining contact and non-contact between conducting members and a side wall member appearing in FIG. 1.

FIG. 2 is a view for explaining contact and non-contact between the conducting members and the side wall member appearing in FIG. 1.

As shown in FIG. 2, the cylindrical side wall member 45 has at a circular end portion 51 thereof, which is at the top in FIG. 2, a plurality of recess-like conducting member housing holes 52 disposed around the circumference of the end portion 51. The conducting members 47 are each disposed extending in the vertical direction in FIG. 2 so as to face a corresponding one of the conducting member housing holes 52.

Figure 3A:
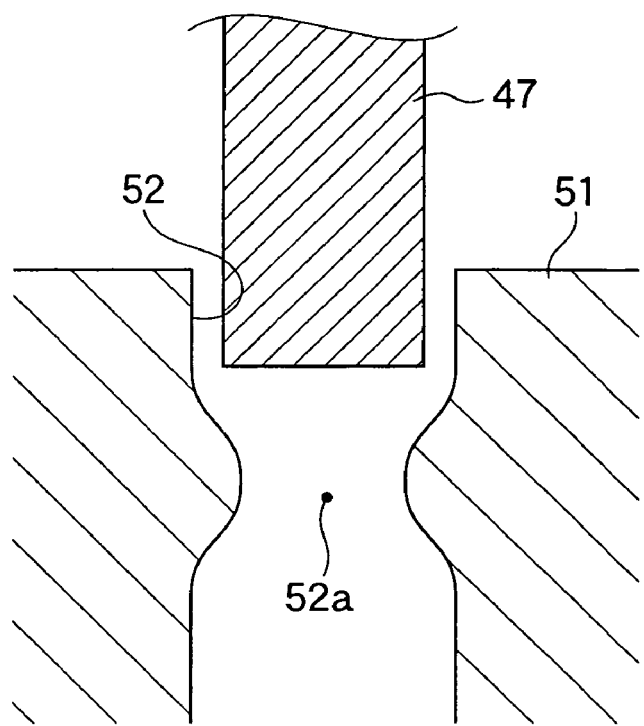
FIGS. 3A and 3B are views for explaining engagement between a tip of a conducting member and a conducting member housing hole appearing in FIG. 2; specifically.
Figure 3B:
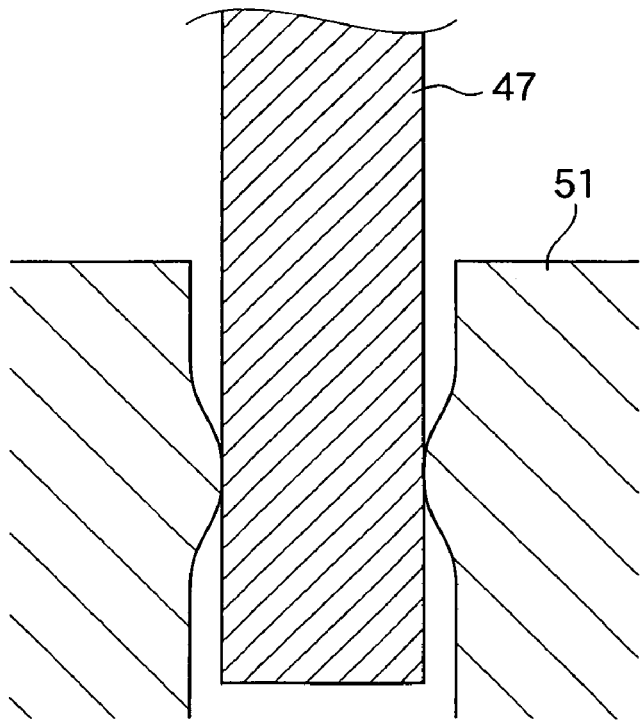

The diameter of each of the conducting member housing holes 52 is slightly larger than the diameter of each of the conducting members 47, and as shown in FIG. 3A, each conducting member housing hole 52 has therein a narrow portion 52a at a place a predetermined distance below (in FIG. 3A) the end portion 51. The diameter of the narrow portion 52a is less than the diameter of the conducting member 47. Moreover, at least one of the narrow portion 52a and the conducting member 47 is an elastic member, being made, for example, of aluminum or copper. Consequently, when the raising/lowering member 50 lowers a tip (projecting portion) of the conducting member 47 as far as the narrow portion 52a, as shown in FIG. 3B, the tip of the conducting member 47 engages with the narrow portion 52a; each of the conducting members 47 thus contacts the side wall member 45, and hence the side wall member 45 is electrically grounded via the potential controlling apparatus 46. Moreover, when the raising/lowering member 50 raises each conducting member 47 above the narrow portion 52a, there is no contact between the conducting member 47 and the narrow portion 52a; there is thus a state of non-contact between each of the conducting members 47 and the side wall member 45, whereby the side wall member 45 is made to be electrically floating. That is, the tip of each of the plurality of conducting members 47 is freely engageable with the corresponding one of the plurality of conducting member housing holes 52.

Prior to the present invention, the present inventors took measurements of the rate of attachment (hereinafter referred to as the "deposition rate") of attached matter (hereinafter referred to as "deposit") such as polymer that becomes attached to component elements exposed to plasma in a conventional plasma processing chamber not having the potential controlling apparatus 46 described above, and the potential difference between each component element and the space in which the plasma is produced in such a conventional plasma processing chamber. Collating the results in the bar charts shown in FIGS. 4A, 4B, and 5, the following findings were made.

Figure 4A:
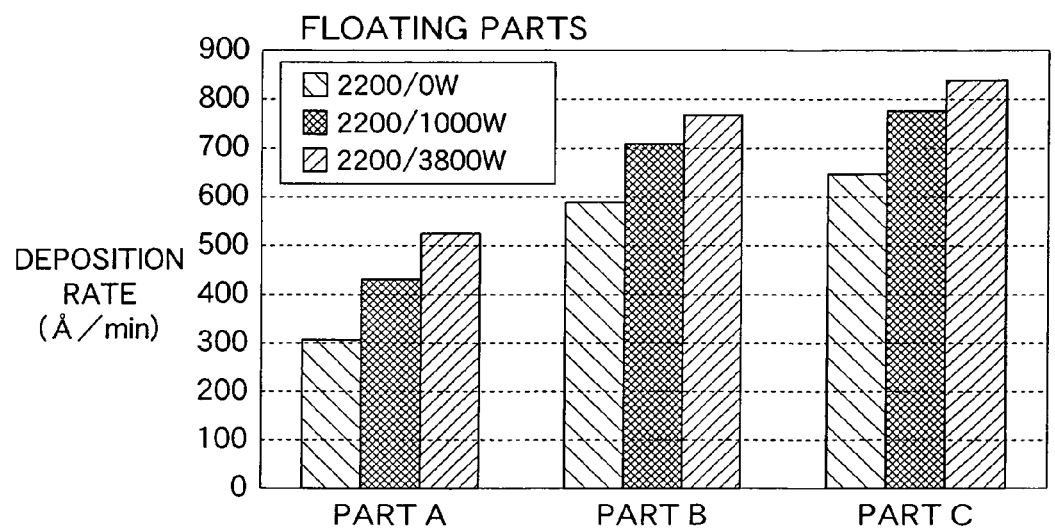
FIGS. 4A and 4B are bar charts showing deposition rates for component elements in a conventional plasma processing chamber; specifically.
Figure 4B:
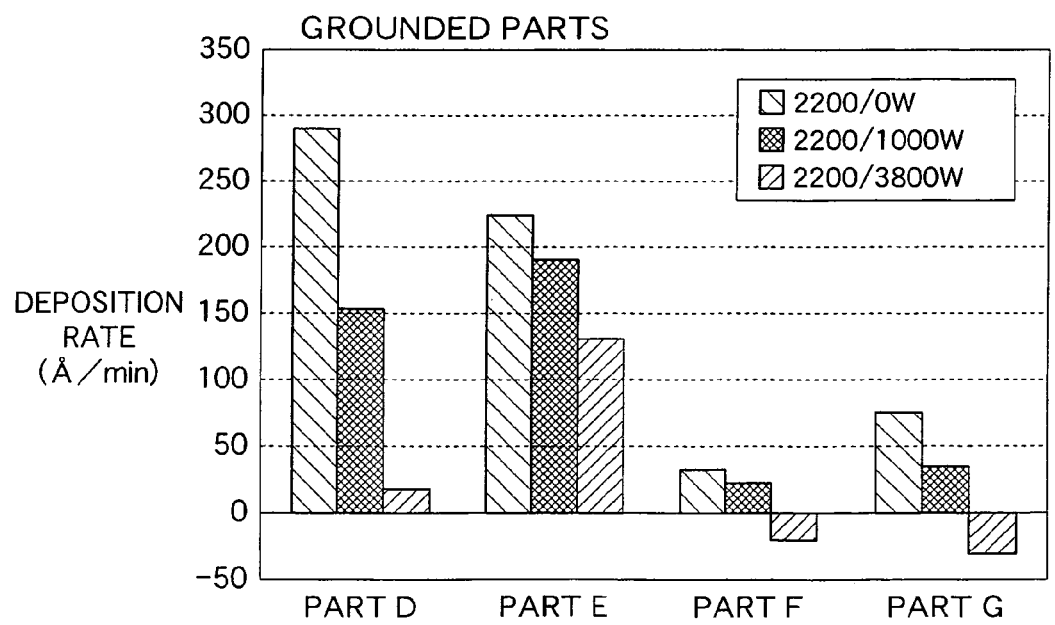
Figure 5:
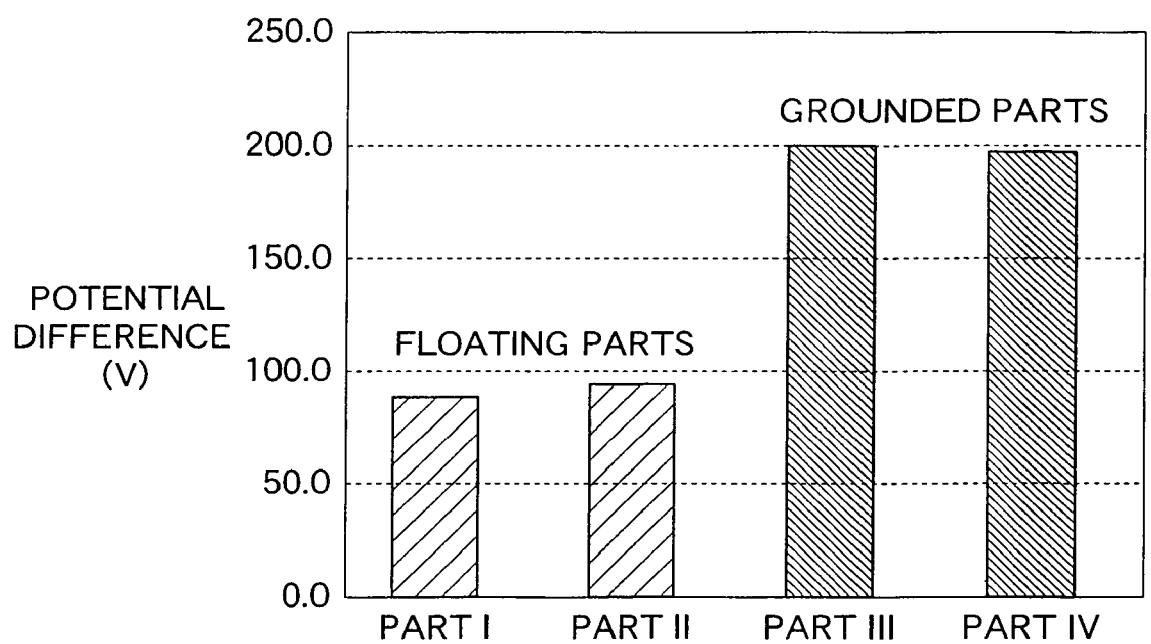
FIG. 5 is a bar chart showing the potential differences between component elements and a space in which plasma is produced in a conventional plasma processing chamber.

As shown in FIGS. 4A and 4B, the deposition rate is greater for electrically floating component elements (hereinafter referred to as "floating parts") (FIG. 4A) than for electrically grounded component elements (hereinafter referred to as "grounded parts") (FIG. 4B), and hence it was found that deposit is attached more readily to floating parts than grounded parts. This is conjectured to be because, as shown in FIG. 5, the potential difference between a part and the space in which the plasma is produced is greater for grounded parts than for floating parts, and hence more of the ions produced when the plasma is formed from the processing gas collide with grounded parts than floating parts, and attached deposit is removed through etching by these ions.

Moreover, as shown in FIGS. 4A and 4B, the upper electrode radio frequency electrical power was fixed at 2200 W, and the lower electrode radio frequency electrical power was set to each of three levels of 0, 1000, and 3800 W, whereupon it was found that for the floating parts, the greater the lower electrode radio frequency electrical power, the more readily deposit was attached, whereas for the grounded parts, the greater the lower electrode radio frequency electrical power, the less readily deposit was attached. In particular, for the grounded parts, it was found that the deposition rate can be made to be substantially zero by increasing the lower electrode radio frequency electrical power. That is, it was found that deposit attached to a component element can be largely removed by making the potential of the component element be a ground potential; there is no need to use a radio frequency power source for the component element.

Based on these findings, in the present invention, when removing deposit from a component element during a depositing process in which deposit is attached to the component element, the potential of the component element is set to a ground potential, whereas when not removing deposit from the component element during a deposit-less process in which deposit is not attached to the component element, the potential of the component element is set to a floating potential.

A potential controlling method implemented in the plasma processing chamber 10 will now be described. Here, two types of processing, i.e. RIE and ashing, are carried out in the plasma processing chamber 10. Moreover, the potential controlling method is implemented by the CPU of the control unit in accordance with a program for the method.

First, in the RIE, ions produced through forming plasma from a processing gas are drawn in toward a resist layer that has been formed on an $SiO_2$ layer on a wafer W and allows parts of the $SiO_2$ layer to be exposed to the space S in accordance with a predetermined wiring pattern. The drawn ions collide with the parts of the $SiO_2$ layer exposed to the space S, thus etching the $SiO_2$ layer in accordance with the predetermined wiring pattern.

In the RIE, a mixed gas of $C_4F_8$ gas and argon gas is used as the processing gas. When this mixed gas is turned into the plasma, large amounts of neutral active species are produced, and these active species become attached to the side wall member 45 as deposit; the RIE is thus a depositing process. Accordingly, in the RIE, regarding the potential controlling apparatus 46, the conducting members 47 are lowered using the raising/lowering member 50 so that the conducting members 47 contact the side wall member 45, whereby the potential of the side wall member 45 is set to a ground potential, and hence deposit attached to the side wall member 45 is removed through etching by the ions.

In the ashing, which is carried out following on from the RIE, ions produced through forming plasma from a processing gas are drawn onto the wafer W, thus removing the resist layer on the wafer W. The resist layer is organic, and hence $O_2$ gas is used as the processing gas. $O_2$ gas does not produce neutral active species as described above, and hence there is no attachment of deposit on the surface of the side wall member 45; the ashing is thus a deposit-less process.

If deposit has been largely removed from the side wall member 45 in the RIE, then the ions produced when the $O_2$ gas is turned into the plasma will remove any deposit still attached to the side wall member 45, and then once this deposit has been removed, the side wall member 45 will be exposed, and hence the ions will etch and thus wear away the exposed side wall member 45. To combat this, in the ashing, regarding the potential controlling apparatus 46, the conducting members 47 are raised using the raising/lowering member 50 so that there is no contact between the conducting members 47 and the side wall member 45, whereby the potential of the side wall member 45 is set to a floating potential, and hence deposit attached to the side wall member 45 is not removed. Wearing away of the side wall member 45 is thus prevented.

According to the plasma processing chamber and the potential controlling method of the present embodiment, the potential of the side wall member 45 that is disposed in the vessel 11 and exposed to the plasma is set to a ground potential during the RIE, and to a floating potential during the ashing. As a result, deposit attached to the side wall member 45 can be largely removed without using a radio frequency power source for the side wall member 45. The amount of deposit attached can thus be controlled easily with a simple construction. Moreover, deposit can be prevented from becoming excessively attached to the side wall member 45 during the RIE which is a depositing process, and wearing away of the side wall member 45 can be prevented during the ashing which is a deposit-less process. The frequency of cleaning of the side wall member 45 can thus be reduced, and moreover wearing away of the side wall member 45 can be prevented. The utilization ratio of the plasma processing chamber 10 can thus be prevented from decreasing.

Moreover, because it is easy to accurately control the amount of attachment of deposit to the side wall member 45, peeling away of deposit from the side wall member 45 during the ashing can be suppressed, and hence a memory effect caused by such peeled away deposit can be prevented.

According to the plasma processing chamber of the present embodiment described above, the side wall member 45 is electrically floating, and the electrically grounded conducting members 47 are freely contactable with the side wall member 45. As a result, switching of the potential of the side wall member 45 between the floating potential and the ground potential can be carried out reliably.

Moreover, according to the plasma processing chamber of the present embodiment described above, the cylindrical side wall member 45 has the recess-like conducting member housing holes 52 therein, the conducting members 47 are rod-shaped members each of which is freely engageable with a corresponding one of the conducting member housing holes 52, each of the conducting member housing holes 52 in the side wall member 45 has a narrow portion 52a therein, and at least one of the narrow portion 52a and the corresponding conducting member 47 that engages therewith is an elastic member. As a result, the potential of the side wall member 45 can be switched between the ground potential and the floating potential by engaging the tip of each conducting member 47 with the corresponding narrow portion 52a or detaching each conducting member 47 away from the corresponding narrow portion 52a. The switching of the potential of the side wall member 45 can thus be carried out reliably with a simple construction.

Furthermore, according to the plasma processing chamber of the present embodiment described above, the side wall member 45 is a cylindrical member, the plurality of conducting member housing holes 52 are disposed in the circular end portion 51 around the circumference of the end portion 51, and the tip of each of the conducting members 47 is freely engageable with a corresponding one of the conducting member housing holes 52. As a result, when the side wall member 45 and the conducting members 47 are in contact with one another, unevenness in the potential in the circumferential direction of the side wall member 45 can be prevented from arising, and hence the amount of attachment of deposit to the side wall member 45 can be controlled uniformly.

In the plasma processing chamber according to the present embodiment described above, the side wall member 45 and the conducting members 47 are made to contact one another through the tip of each of the rod-shaped conducting members 47 being engaged with a corresponding one of the conducting member housing holes 52 in the side wall member 45. However, the conducting members 47 are not limited to being rod-shaped, but rather may be any shape having a projecting portion engageable with one of the conducting member housing holes 52.

Figure 6:
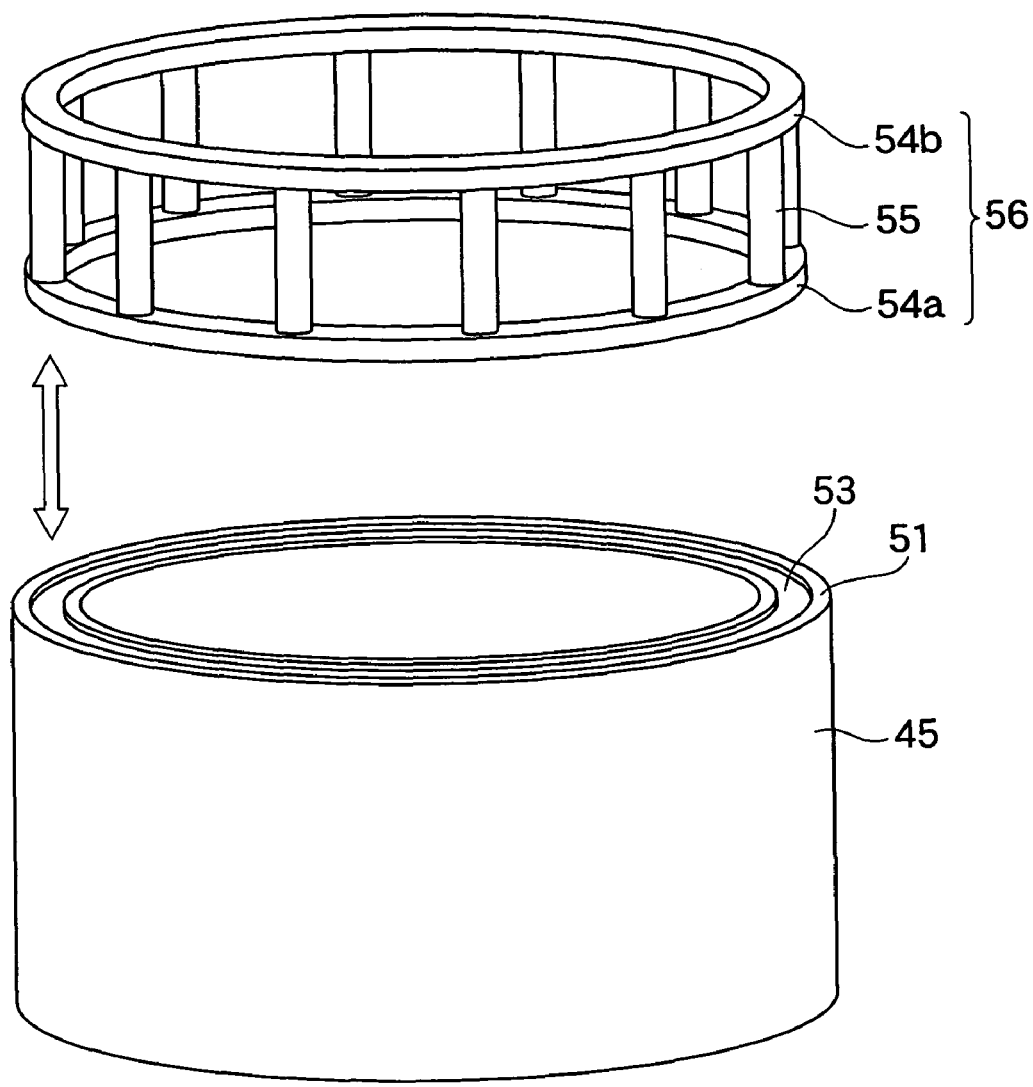
FIG. 6 is a view for explaining contact/non-contact between an engaging member and the side wall member according to a variation of a potential controlling apparatus appearing in FIG. 1.

Moreover, a construction as shown in FIG. 6 may be adopted in which the side wall member 45 has in the circular end portion 51 thereof a groove 53 that is formed extending around the circumference of the end portion 51, and the potential controlling apparatus 46 has, instead of the conducting members 47, a retiform engaging member 56 (component element contacting member) comprised of two rings 54a and 54b that have the same diameter as the groove 53 and are disposed with the same central axis, and a plurality of rod-shaped linking members 55 that link the two rings 54a and 54b together. The engaging member 56 is grounded via a raising/lowering apparatus (not shown) that raises/lowers the engaging member 56. The engaging member 56 can be engaged with the groove 53 so as to contact the side wall member 45 and thus put the side wall member 45 into an electrically grounded state, or be detached away from the groove 53 so as to not contact the side wall member 45 and thus put the side wall member 45 into an electrically floating state. Here, it is to be understood that the width of the rings 54a and 54b is less than the width of the groove 53, and the groove 53 has therein a narrow portion (not shown) having a width less than the width of the rings 54a and 54b.

When the engaging member 56 is engaged with the side wall member 45, the engaging member 56 contacts the side wall member 45 around the whole circumference thereof. As a result, unevenness in the potential in the circumferential direction of the side wall member 45 can be reliably prevented from arising, and hence the amount of attachment of deposit to the side wall member 45 can be controlled yet more uniformly.

The plasma processing chamber according to the embodiment described above has a lower electrode and an upper electrode, each of the electrodes being connected to a radio frequency power source. However, the upper electrode need not be connected to a radio frequency power source. In this case, the ceiling electrode plate 38 is an electrically floating ceiling plate, and hence deposit will become attached to the ceiling electrode plate 38 during a depositing process. It is thus preferable to provide a ceiling plate potential controlling apparatus having a similar construction to the potential controlling apparatus 46, and control whether the conducting members of the ceiling plate potential controlling apparatus are in contact with or not in contact with the ceiling electrode plate 38, so as to set the potential of the ceiling electrode plate 38 to a ground potential or a floating potential, and thus control the amount of attachment of deposit to the ceiling electrode plate 38.

Alternatively, in the case that the upper electrode is not connected to a radio frequency power source, the side wall member 45 and the ceiling plate may be integrated with one another. In this case, the conducting members 47 of the potential controlling apparatus 46 may contact either one of the side wall member 45 and the ceiling plate.

Moreover, even in the case that the upper electrode is connected to a radio frequency power source, a ceiling plate potential controlling apparatus may be provided. As a result, during plasma processing in which radio frequency electrical power is not supplied to the upper electrode, the potential of the ceiling electrode plate 38 can be controlled so as to control the amount of attachment of deposit to the ceiling electrode plate 38.

Next, a plasma processing chamber according to a second embodiment of the present invention will be described.

For the present embodiment, the construction and operation are basically the same as for the first embodiment described above, the only difference being that the potential of the side wall member 45 is controlled not by the potential controlling apparatus 46 having the rising/falling conducting members 47, but rather by a potential controlling apparatus comprised of an electrical circuit. Features of the construction and operation that are the same as in the first embodiment described above will thus not be described here, with only features that are different to the first embodiment being described.

Figure 7:
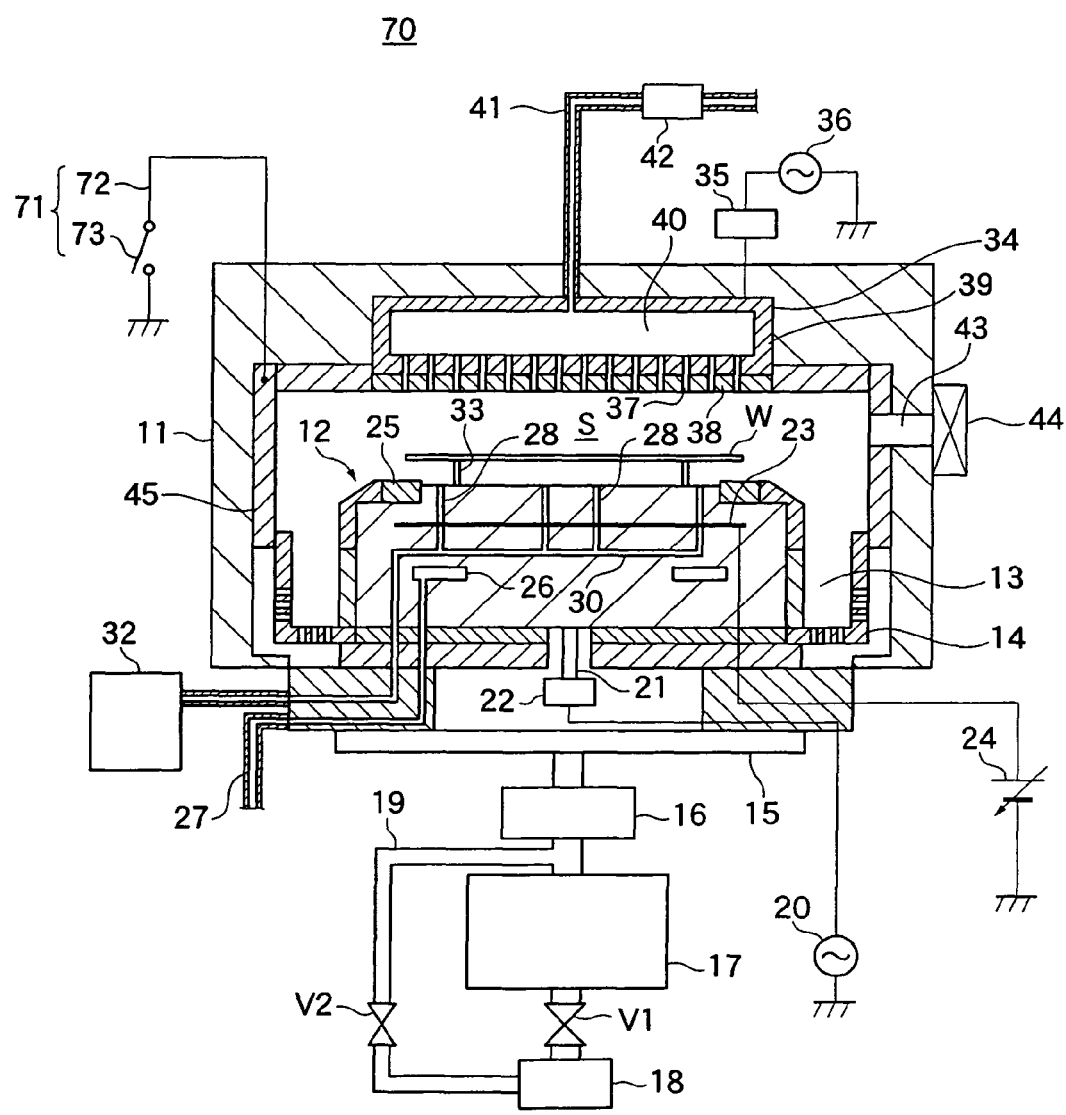
FIG. 7 is a sectional view schematically showing the construction of a plasma processing chamber according to a second embodiment of the present invention.

FIG. 7 is a sectional view schematically showing the construction of the plasma processing chamber according to the present embodiment. As for the plasma processing chamber 10 shown in FIG. 1, the plasma processing chamber of the present embodiment is also constructed so as to be able to carry out RIE and ashing on semiconductor wafers W.

As shown in FIG. 7, the potential arising on the side wall member 45 in the plasma processing chamber 70 is controlled by a potential controlling apparatus 71, described below.

The potential controlling apparatus 71 has a grounding line 72 that is connected to the side wall member 45 for grounding the side wall member 45, and a switch 73 (switching device) that is disposed in the grounding line 72 for switching between disconnection and connection of the grounding line 72 to ground. In the potential controlling apparatus 71, the switch 73 is used to set the potential of the side wall member 45 to a floating potential by disconnecting the grounding line 72 from ground, and set the potential of the side wall member 45 to a ground potential by connecting the grounding line 72 to ground.

A potential controlling method implemented by the plasma processing chamber 70 will now be described. As described above, two types of processing, i.e. RIE and ashing, are carried out in the plasma processing chamber 70. Moreover, the potential controlling method is implemented by the CPU of the control unit in accordance with a program for the method.

First, in the RIE, which is a depositing process, the potential controlling apparatus 71 connects the grounding line 72 to ground using the switch 73, thus setting the potential of the side wall member 45 to the ground potential, whereby deposit attached to the side wall member 45 is removed through etching by ions.

Then, in the following ashing, which is a deposit-less process, the potential controlling apparatus 71 disconnects the grounding line 72 from ground using the switch 73, thus setting the potential of the side wall member 45 to the floating potential, whereby deposit attached to the side wall member 45 is not removed. Wearing away of the side wall member 45 is thus prevented.

According to the plasma processing chamber and the potential controlling method of the present embodiment, the potential of the side wall member 45 is set to a ground potential during the RIE, and to a floating potential during the ashing, using the potential controlling apparatus 71 comprised of the grounding line 72 that is for grounding the side wall member 45, and the switch 73 that is disposed in the grounding line 72 for switching between disconnection and connection of the grounding line 72 to ground. As a result, the potential of the side wall member 45 can be switched between the floating potential and the ground potential with a simple construction, and hence the amount of deposit attached can be controlled readily.

The potential controlling apparatus 71 in the plasma processing chamber according to the present embodiment described above is comprised of the grounding line 72 and the switch 73. However, the potential controlling apparatus 71 may have a variable impedance element such as a variable inductor or a variable capacitor disposed in the grounding line 72. As a result, the rate of change of the potential of the side wall member 45 can be controlled, and hence the amount of deposit attached can be controlled more finely.

Moreover, the variable impedance element may change the impedance in accordance with the amount of deposit attached to the side wall member 45. As a result, the potential of the side wall member 45 can be controlled in accordance with the amount of deposit attached, and hence the amount of deposit attached can be controlled more finely. Furthermore, the variable impedance element may change the impedance in synchronization with the frequency of the electrical power supplied by the radio frequency power source 20. As a result, fluctuations in the amount of deposit attached caused by fluctuations in the electrical power can be suppressed.

The potential controlling apparatus in the plasma processing chamber according to each of the embodiments described above has either a mechanical construction (the potential controlling apparatus 46) or an electrical circuit construction (the potential controlling apparatus 71). However, the potential controlling apparatus may have both a mechanical construction and an electrical circuit construction. Specifically, a construction may be adopted in which the base 49 of the potential controlling apparatus 46 is electrically grounded via a switch. In this case, when it is necessary to change the potential of the side wall member 45 rapidly, the conducting members 47 are raised/lowered, whereas when it is necessary to finely adjust the potential of the side wall member 45, the grounding line is disconnected/connected using the switch. As a result, the potential of the side wall member 45 can be set to an optimum potential in accordance with changes in the processing contents of the plasma processing, and hence the amount of deposit attached can be controlled to an optimum amount.

The substrates processed in the plasma processing chamber according to each of the embodiments described above are semiconductor wafers. However, the substrates processed are not limited thereto, but rather may instead be, for example, LCD (liquid crystal display) or FPD (flat panel display) glass substrates.

It is to be understood that the object of the present invention can also be attained by supplying to a computer connected to the plasma processing chamber or the control unit described above (hereinafter referred to as "a computer or the like") a storage medium in which is stored a program code of software that realizes the functions of each of the embodiments as described above, and then causing a CPU of the computer or the like to read out and execute the program code stored in the storage medium.

In this case, the program code itself read out from the storage medium realizes the functions of each of the embodiments, and hence the program code and the storage medium in which the program code is stored constitute the present invention.

The storage medium for supplying the program code may be any storage medium in which the program code can be stored, for example a RAM, an NV-RAM, a floppy (registered trademark) disk, a hard disk, an optical disk, a magnetic-optical disk, a CD-ROM, a CD-R, a CD-RW, a DVD-ROM, a DVD-RAM, a DVD-RW, a DVD+RW, a magnetic tape, a nonvolatile memory card, or a ROM. Alternatively, the program code may be supplied to the computer or the like by being downloaded from another computer, a database, or the like, not shown, connected to an internet, a commercial network, a local area network, or the like.

Moreover, it is to be understood that the functions of each of the embodiments can be accomplished not only by executing a program code read out by the computer or the like, but also by causing an OS (operating system) or the like which operates on the CPU of the computer or the like to perform a part or all of the actual operations based on instructions of the program code.

Furthermore, it is to be understood that the functions of each of the embodiments can also be accomplished by writing a program code read out from a storage medium into a memory provided on an expansion board inserted into the computer or the like or in an expansion unit connected to the computer or the like and then causing a CPU or the like provided on the expansion board or in the expansion unit to perform a part or all of the actual operations based on instructions of the program code.

The form of the program code may be, for example, object code, a program code executed by an interpreter, or script data supplied to an OS.

What is claimed is:

1. A plasma processing chamber having a vessel housing a substrate, and at least one electrode that is disposed in said vessel and is connected to a radio frequency power source, wherein at least two types of plasma processing can be carried out on the substrate using plasma produced from a processing gas introduced into said vessel, the plasma processing chamber further comprising:

a processing chamber component element that is disposed in said vessel and exposed to the plasma; and a potential controlling apparatus that sets a potential of said processing chamber component element to either a floating potential or a ground potential in accordance with which of the at least two types of plasma processing is carried out, wherein said processing chamber component element is electrically floating, and said potential controlling apparatus has at least one electrically grounded component element contacting member, said at least one component element contacting member being movable to either engage or disengage said processing chamber component element in accordance with which of the at least two types of plasma processing is carried out, wherein said processing chamber component element has at least one recess-like hole therein, and said at least one component element contacting member has a projecting portion that is engageable with said at least one recess-like hole, and wherein said at least one recess-like hole has a narrow portion therein, and at least one of said narrow portion and said projecting portion includes an elastic member.

2. A plasma processing chamber as claimed in claim 1, wherein said component element contacting member engages said processing chamber component element when a depositing process is carried out, and said component element contacting member disengages said processing chamber component element when a deposit-less process is carried out.

3. A plasma processing chamber as claimed in claim 1, wherein said vessel is cylindrical, said processing chamber component element is a cylindrical member covering an inner peripheral surface of said vessel, a plurality of said recess-like holes are disposed around a circumference of said cylindrical member, and said projecting portion of each of a plurality of said component element contacting members is freely engageable with a corresponding one of said recess-like holes.

4. A potential controlling apparatus of a plasma processing chamber that includes a vessel housing a substrate and at least one electrode disposed in the vessel and connected to a radio frequency power source, the plasma processing chamber being able to carry out at least two types of plasma processing on the substrate using plasma produced from a processing gas introduced into the vessel, the potential controlling apparatus comprising:

at least one electrically grounded component element contacting member, wherein a potential of a processing chamber component element, which is disposed in the vessel in the plasma processing chamber in which, the processing chamber component element being exposed to the plasma, can be set to either a floating potential or a ground potential in accordance with which of the at least two types of plasma processing is carried out, wherein the processing chamber component element is electrically floating, and said at least one component element contacting member is movable to either engage or disengage the processing chamber component element in accordance with which of the at least two types of plasma processing is carried out, wherein the processing chamber component element has at least one recess-like hole therein, and said at least one component element contacting member has a projecting portion that is engageable with said at least one recess-like hole, wherein said at least one recess-like hole has a narrow portion therein, and at least one of said narrow portion and said projecting portion includes an elastic member.

5. A potential controlling apparatus as claimed in claim 4, wherein the component element contacting member engages the processing chamber component element when a depositing process is carried out, and the component element contacting member disengages the processing chamber component element when a deposit-less process is carried out.

* * * * *